United States Patent [19]

Beil

[11] 4,020,206

[45] Apr. 26, 1977

[54] THICK-FILM CIRCUIT ON A SUBSTRATE WITH THROUGH-CONTACTS BETWEEN CONDUCTOR PATHS ON OPPOSITE SIDES OF THE SUBSTRATE

[75] Inventor: Martin Beil, Munich, Germany

[73] Assignee: Siemens Aktiengesellschaft, Berlin & Munich, Germany

[22] Filed: May 30, 1975

[21] Appl. No.: 582,380

Related U.S. Application Data

[63] Continuation-in-part of Ser. No. 445,939, Feb. 26, 1974, abandoned.

[30] Foreign Application Priority Data

Feb. 28, 1973 Germany .......................... 2310062

[52] U.S. Cl. .............................. 428/137; 252/514; 252/518; 252/520; 427/97; 427/125; 427/126; 427/380; 427/383 A; 428/210; 428/428; 428/446; 428/472; 428/539

[51] Int. Cl.$^2$ ...................... B05D 5/12; B32B 3/10

[58] Field of Search ............ 427/97, 125, 126, 279, 427/256, 376, 383, 380, 357; 252/514, 516, 518; 428/195, 210, 137, 428, 446, 539, 472

[56] References Cited

UNITED STATES PATENTS

| | | | |
|---|---|---|---|
| 3,401,126 | 9/1968 | Miller et al. ....................... | 427/126 |
| 3,445,210 | 5/1969 | Matsuzaki et al. ................ | 428/428 |
| 3,505,134 | 4/1970 | Short ................................. | 252/514 |

OTHER PUBLICATIONS

Elmgren, J.A. et al. Thru–hole Metallization in Ceramics, In IBM Technical Bulletin, 17(8):p. 2257. Jan. 1975.

Primary Examiner—Cameron K. Weiffenbach
Attorney, Agent, or Firm—Hill, Gross, Simpson, Van Santen, Steadman, Chiara & Simpson

[57] ABSTRACT

A thick-film circuit on a ceramic substrate has circuit paths on opposite sides thereof interconnected with one another by through holes in the substrate filled with a paste which includes grains of a refractory material therein. After sintering, a conductive path results which is substantially non-shrinking. The through holes are preferably filled using a device having a pair of resilient doctor blades arranged to form a V-shaped groove therebetween. An amount of such conductive paste is placed in the groove and a substrate with through holes therein is advanced through the V-shaped groove so that the paste is squeezed into the through holes and the flat surfaces of the substrate are wiped clean by the doctor blades.

1 Claim, 3 Drawing Figures

THICK-FILM CIRCUIT ON A SUBSTRATE WITH THROUGH-CONTACTS BETWEEN CONDUCTOR PATHS ON OPPOSITE SIDES OF THE SUBSTRATE

RELATED APPLICATION

This application is a continuation-in-part of my earlier filed U.S. patent application Ser. No. 445,939 filed Feb. 26, 1974 now abandoned.

BACKGROUND OF THE INVENTION

1. Field of the Invention

The invention relates to the field thick-film circuits on ceramic substrates, and more particularly, to thick-film circuits having conductor paths on opposite sides of a ceramic substrate which are interconnected by through-contacts in the substrate. The invention further related to technology for producing substrate through contacts.

2. Prior Art

Thick-film circuits having a through-contact arrangement require particular care during manufacture. The walls of the connecting holes, or so-called through-holes, in the ceramic substrate of a thick film circuit may be wetted with high viscosity metal dispersions. After heating, such dispersions produce a conductive path extending through such so wetted through-holes which interconnect, conductor paths on opposite sides of the ceramic substrate. In certain present-day thick-film technology, the through holes are exposed to a vaporized material so that a conductive film is deposited on the entire hole wall. Metal pins are then soldered into the holes.

German Auslegeschrift 1,590,345 discloses a technique wherein copper pins which are coated with a brazing solder are placed in through-holes and are then raised to a sufficiently high temperature, by a passing a current pulse through the pins so that the brazing solder melts while the material forming the conductor paths does not. However, this procedure is expensive for manufacture of sandwich circuits (i.e. circuits having conductor paths on opposite sides of a substrate), since the procedure for establishing through-contacts differs from that employed to produce the conductor paths.

Also in the prior art, through-holes in ceramic substrates have been filled with conventional conductor path pastes of the screen printing type and then sintered. However, the shrinkage of such pastes during the sintering or heat treatment is of such magnitude that electrical connection through the resulting through-contacts in such filled holes often ruptures. Accordingly, this technique is not reliable for mass production of thick-film circuits.

SUMMARY OF THE INVENTION

The invention provides a through hole filling composition or medium which does not shrink substantially, i.e., preferably less than about 5% by volume during sintering, and thus can be used to fill through-holes in ceramic substrates with sintered conductive paths so as to interconnect circuit having conductor paths on opposite sides of the substrate. The medium utilized can also optionally be used to form the conductor paths so that the process of establishing throughcontacts may be essentially identical to that used for forming the conductor paths.

The invention also provides an apparatus for filling through holes in ceramic substates using such a composition, or the like.

The invention further provides ceramic substrates which have been filled with such a composition and then sintered.

It is a novel feature of the invention to provide a screen printing paste which has refractory particles or grains therein adapted for use in forming conductive paths in through holes of ceramic substrates and which does not shrink substantially when sintered.

It is a further novel feature of the invention to provide a device for manufacturing thick-film circuits comprised of a pair of resilient doctor blades mounted to define a V-shaped groove therebetween which accommodates an amount of paste so that when a pierced substrate (that is, one having at least one through hole) is forced through the groove, the doctor blades squeeze paste into a through-hole and wipe the other surfaces clean.

It is a further novel feature of this invention to provide, particularly for the art of making thick film circuits, ceramic substrates. which have the through holes therein filled with through contact electrically conductive material which does not shrink substantially during a sintering operation (compared to the dried composition used to fill such holes).

Other and further features, aims, purposes, advantages and the like will be apparent to those skilled in the art from the present specification taken with the accompanying drawings.

DETAILED DESCRIPTION

Figure 1:
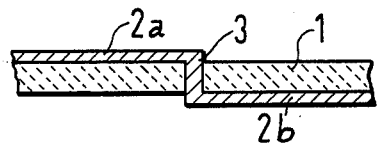
FIG. 1 is a vertical sectional view through an embodiment of a thick-layer circuit produced in accordance with the principles of the invention, some portions thereof being broken away.

In one aspect, this invention is directed to improved paste compositions, typically of the so-called screen printing class or the like, which, when sintered at a temperature ranging from about 800° to 1000° C., produce conductive paths therethrough, and which are adapted for use as through hole filling compositions in ceramic substrates. Such a composition of this invention, when so sintered, is comprised of material which has not shrunk substantially. As used herein the term "shrunk substantially", or the equivalent language, has reference to the fact that a composition of this invention, particularly when use for through hole filling in ceramic substrates followed by drying and sintering as taught herein do not shrink by volume more than about 5% compared to a so dired such composition.

In another aspect, this invention is directed to a device for filling through-holes in thick-film circuits having conductor paths on opposite sides of a substrate interconnected to one another at said holes. Such a device includes a support means, and a pair of resilient doctor blades mounted in opposite relation within said support means so as to define a V-shaped groove therebetween. The device is such that an amount of paste can be placed in the groove and a pierced substrate is (e.g. a ceramic substrate having at least one through hole) can be advanced through the groove so that said doctor blades squeeze paste into through holes of the pierced substrate and simultaneously wipe flat surfaces thereof.

In another aspect, this invention is directed to a thick film circuit structure of the type comprising an electrically insulative ceramic substrate in the form of a flattened structure having a pair of opposed, generally parallel side faces and having at least one through hole extending therethrough from one such face to the other thereof. Such substrate can have conductor paths deposited upon each of its side faces, and, typically, at least one such conductor path on each said side face is located in adjacent relationship to the perimeter of such one through hole. By the present invention, a conductive path extending through and substantially completely filling such one through hole is provided. This conductive path is formed by filling substantially completely such one through hole with a paste composition of this invention followed sequentially by drying and sintering as taught by this invention.

In accord with the present invention, refractory particles, or grains, dispersed in a screen printing paste ensure that, at the time of sintering, a cavity-free, through-contact is produced in a through hole of a ceramic substrate. The refractory particles employed are pulverized, sized (preferably), and intermixed into a conductive screen printing paste to achieve a substantially homogeneous mixture. A diluting oil may optionally be added to the mixture to achieve a desired specific viscosity. Glass powders (e.g. frits) may optionally be added to the mixture to improve the internal strength thereof after sintering.

The refractory particles suitable for use in the practice of this invention are conventional in composition. In general, such particles are inorganic and have sizes ranging from about 5 to 8 microns. Such particles do not melt at temperatures below about 1000° C., so that, when incorporated into a through hole filling composition of this invention, such particles maintain their original shape and size during a sintering operation after such composition has been used to fill through holes in a ceramic substrate.

Preferably, the refractory particles utilized in the practice of the invention are composed of an inorganic material selected from the group consisting of metallic carbides, such as silicon carbide; metallic oxides, such as aluminum oxide; quartz (crystallized silicon dioxide); and including mixtures thereof. Of such refractory materials, those having an inherent electrical conductivity are preferred, such as, for example, silicon carbide.

The exact amount of refractory particles incorporated into a through hole filling composition in accord with the teachings of this invention can vary widely. Amounts ranging from about 5 to 50 weight percent (total composition weight basis) can be useful; however, amounts of such refractory materials in the range from about 15 to 40 weight percent (same basis) are more preferred, since shrinkage in a product composition during sintering appears to be minimized with such concentrations.

The starting material compositions utilized in the practice of this invention are gold pastes. Typical and preferred starting pastes comprise conventional screen printing pastes which are well-known to the art for use in the manufacture of thick-film circuits for the formation of conductor paths on ceramic substrates. Such screen printing pastes comprise essentially a metal powder, a glass frit and an organic support or carrier medium. Suitable compositions of such screen printing pastes and methods for their preparation are exemplified in U.S. Letters Patent 3,505,134 to Short (issued Apr. 7, 1970). Suitable such compositions are available commercially. For example, the DuPont Company of Wilmington, Delaware currently offers for sale microcircuit conductor and semiconductor packaging gold compositions under the designations 8380 and 8780 which are suitable screen printing pastes for use in the practice of this invention. The precise chemical composition of the starting screen printing paste has no particular importance on the present invention.

However, for purposes of characterization and illustration, a typical and presently preferred starting paste composition for use in this invention comprises on a 100 weight percent total composition basis:

A. from about 78 to 82 weight percent of gold in the form of particles at least about 90 weight percent of which have number average particle sizes not greater than about 10 microns and not more than about 5 weight percent of which are larger than about 25 microns, B. from about 3 to 6 weight percent of an inorganic binder comprised of a preformed fritted glass in the form of particles having a number average size of less than about 30 microns and characterized by a capacity to sinter when exposed to temperatures ranging from about 800° to 1000° C., said glass comprising on a 100 weight percent total glass weight basis
from about 30 to 65 weight percent PbO from about 8 to 35 weight percent $SiO_2$ from about 0.5 to 7 weight percent $Al_2O_3$ from about 0 to 10 weight percent $TiO_2$
said glass further optionally containing:
from about 10 to 30 weight percent $B_2O_3$
in combination with
from about 10 to 30 weight percent LiO and
from about 10 to 30 weight percent CdO by replacement of up to about 25 weight percent of each of said PbO and said $SiO_2$ therewith, and C. from about 12 to 18 weight percent of at least one organic liquid which is substantially inert as respects said gold, said inorganic binder, and said particles.

Preferably a starting gold powder has a number average particle size not greater than about 5 microns, and, more preferably, is in the size range from about 0.1 to 10 micron.

A presently preferred fritted glass is an alumino boro silicate glass characterized by the following composition on a 100 weight percent total weight basis:
PbO about 30 to 40 wt. %
$SiO_2$ about 8 to 12 wt. %
$Al_2O_3$ about 2 to 7 wt. %
LiO about 20 to 30 wt. %
$B_2O_3$ about 20 to 20 wt. %

In a starting paste composition, the gold metal powder and the inorganic binder are dispersed (suspended) in an organic vehicle whose composition can vary widely. Such a vehicle can be as described in the prior art. The amount of vehicle employed is such, in any given composition, to impart thereto a desired paste like consistency, as those skilled in the art will appreciate.

The liquid vehicle, diluting oils, or organic fluid support media, etc. which are generally suited for use in the through hole filling compositions of this invention are conventional and well known to this art. Examples include such materials as pine oil, diethylene glycol monobutyl ether acetate, isoamyl salicylate, mixtures thereof, and the like, such materials being commonly incorporated into conventional screen printing pastes as organic support media or the like. For example, one preferred liquid vehicle is a mixture of about 2 parts by weight of diethylene glycol monobutyl ether acetate with about 1 part by weight of isoamyl solicylate. The amount of vehicle, diluting oil or organic fluid support media employed in any given composition can vary widely, but, in general, compositions of this invention are formulated so as to have a paste-like consistency as made. On a total weight basis, the total quantity of organic fluid present in a composition of this invention depends upon such variables as viscosity, quantity of metal present, conductivity desired in product sintered conductive path, and the like, as those skilled in the art will appreciate.

Refractory particles may be blended with a starting paste composition by an convenient mixing procedure, as those skilled in the art will readily appreciate, to produce a desired uniformity in product.

In general, a paste composition of this invention comprises (on a 100 weight percent total weight basis)
1. from about 48 to 64 weight percent of gold in the form of particles at least about 90 weight percent of which have number average particle sizes not greater than about 10 microns and not more than about 5 weight percent of which are larger than about 25 microns,
2. from about 3 to 9 weight percent of an inorganic binder comprised of a preformed fritted glass in the form of particles having a number average size of less than about 30 microns and characterized by a capacity to sinter when exposed to temperatures ranging from about 800° to 1000° C., said glass comprising on a 100 weight percent total glass weight basis
   from about 30 to 65 weight percent PbO from about 8 to 35 weight percent $SiO_2$ from about 0.5 to 7 weight percent $Al_2O_3$ from about 0 to 10 weight percent $TiO_2$
   said glass further optionally containing:
   from about 10 to 30 weight percent $B_2O_3$
   in combination with
   from about 10 to 30 weight percent LiO and
   from about 10 to 30 weight percent CdO by replacement of up to about 25 weight percent of each of said PbO and said $SiO_2$ therewith,
3. from about 15 to 40 weight percent of inorganic refractory particles having a size in the range from about 5 to 8 microns and characterized by a capacity to not melt at temperatures below about 1000° C., said particles being selected from the group consisting of metal carbides, metal oxides, and quartz, and
4. from about 9 to 12 weight percent of at least one organic liquid which is substantially inert as respects said gold, said inorganic binder and said particles.

One preferred class of refractory particles comprises silicon carbide; when silicon carbide is used, a composition of this invention preferably contains from about 25 to 27 weight percent thereof. Another preferred class of refractory particles comprises aluminum oxide; when aluminum oxide is used, a composition of this invention preferably contains from about 15 to 25 weight percent thereof (same basis).

A preferred glass is an alumino boro silicate as characterized above; such a glass appears to enhance interior stability of through contacts in through holes prepared as taught by this invention.

Ceramic substrates suitable for use in the practice of this invention are of the conventional inorganic electrically insulating variety known to the prior art. Compositionally, such substrates can comprise a material such as forsterite, sapphire, steatite, titanium dioxide, alkali earth titanates, zircon, porcelain, alumina and the like. The dimensions of such a substrate can vary widely, as those skilled in the art will appreciate, though commonly used ceramic substrates in the field of thick-film circuits currently have thicknesses ranging from about 0.2 to 1.5 mm, lengths ranging from about 10 to 100 mmn, and widths ranging from about 10 to 200 mm. The through-holes in such a substrate can vary widely in cross sectional size and shape, but most commonly such through-holes tend to be generally circular in cross section, and commonly such through-holes have a generally uniform cross sectional area along their individual lengths. Typically, in the field of thick film circuits, the cross sectional area of a through-hole falls in the range of from about 0.008 to 0.8 square mm. Commonly, a through hole extends transversely (perpendicularly) through a ceramic substrate such as is shown, for example, in FIG. 1 of the accompanying drawings, but, it two or more ceramic substrates happen to be placed together in face-to-face engagement, the through hole in one such substrate member need not be aligned transversely with the through hole in another such substrate member, provided, of course, there is an inter-connection pathway provided between the two holes, such as, for example, a channel formed in a face of one or both such substrates, such as shown, for example, in FIG. 2 of the accompanying drawings. Through holes can be formed by any conventional like. including mechanical means (drilling), laser beams, and the like.

Through holes in a ceramic substrate can be filled with a through hole filling composition of this invention by any convenient technique, as those skilled in the art will appreciate. It is much preferred, however, to fill through holes in a ceramic substrate with apparatus as taught herein and as illustrated for example, in FIG. 3 herein, and as explained hereinbelow.

After through holes in a ceramic substrate have been filled with a through hole filling composition of this invention, the resulting substrate is dried to remove volatiles, such as the diluting oil or organic fluid support media, present in the filling composition. Any convenient drying conditions may be employed. In general, drying is conducted at temperatures below about 200° C. One preferred set of drying condition is to expose such a through hole filled ceramic substrate for 5 to 15 minutes first to room temperatures to permit leveling and then to expose such an exposed substrate to temperatures of from 120° ÷ 150° C., for a time sufficient to dry substrate thoroughly (typical suitable times commonly ranging from 10 ÷ 30 minutes, though longer and shorter times may be employed).

Thereafter, the dried such ceramic substrate is subjected to sintering. As those skilled in the art appreciate, sintering temperatures for a through hole filling composition of this invention are generally under about 1000° C but over 800° C. Sintering time is generally not more than about 1 hours. For example, the above-noted DuPont compositions 8389 and 8780 which have been combined with refractory particles as taught by this invention are preferably fired (sintered) at a peak temperature of from about 850° to 950° C. for a time of about 5 to 10 minutes, with the total sintering time typically being not more than about 45 minutes. The exact such time and such temperature in any given instance is sufficient to sinter a given composition of this invention, thereby to produce a desired conductive path in a through hole, such conductive path being comprised of material which has not shrunk substantially compared to the starting paste composition of this invention in a dried condition.

In a ceramic substrate product of this invention, shrinkage is usually less than about 5% by volume, as defined above, and, in preferred products, shrinkage typically ranges from about 2 to 4%. Untreated starting paste compositions containing no refractory material particles can display shrinkage up to 50 or 60% by volume, or even more, upon comparable sintering (based on wet paste), and up to 20 or 30% by volume, or even more, based on dried paste.

Referring now to the drawings, a ceramic substrate 1 is shown having conductor paths 2a and 2b on opposite sides thereof. A through-contact 3 formed of a paste in accordance with the principles of the invention interconnects paths 2a and 2b.

Figure 2:
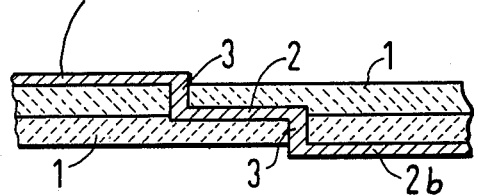
FIG. 2 is a somewhat similar view of another embodiment of a thick-film circuit produced in accordance with the principles of the ivnention.

The embodiment of FIG. 1 is a substrate with a conductive film on both sides the thereof while the embodiment of FIG. 2 is a sandwich circuit.

Figure 3:
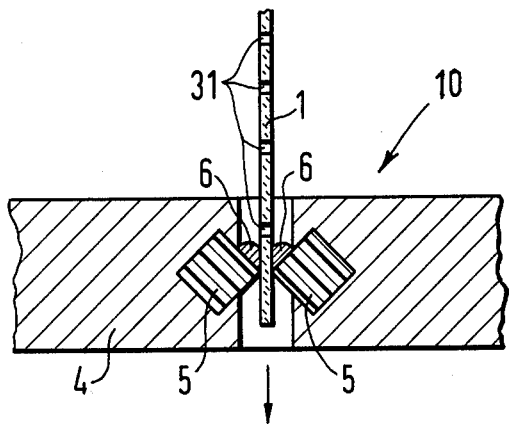
FIG. 3 is a partial schematic illustration of a device useful in filling through holes in circuits such as illustrated in FIGS. 1 and 2.

FIG. 3 illustrates a device 10 for filling up through-holes 31 in a substrate 1. The device 10 includes a pair of opposed elastic (resilient) scraper or doctor blades 5 mounted within a support means 4 so as to define a cross-sectionally V-shaped groove between blades 5. Preferably the blades 5 are positioned so as to extend generally horizontally when device 10 is in use. A quantity of paste 6, such as a composition of this invention, is placed in the groove. A pierced substrate 1 (that is, a ceramic substrate having through holes 31) is then advanced through the groove in a direction which is generally perpendicular with respect to the region between the edges of the blades 5, the space between blades 5 being preferably sufficiently adjustable to accommodate various thicknesses of different substrates, but still suitable for maintaining blades 5 in contact with both opposed faces of a given substrate when such is moved therebetween. As the pierced substrate 1 is moved through the V-shaped groove, blades 5 function to squeeze paste 6 into through-hole 31 of substrate 1 and simultaneously to wipe off paste 6 from the adjacent flat facial surfaces of substrate 1.

Sandwich circuits are produced by stacking printed and throughcontact substrates into blocks, which are then sintered together.

EMBODIMENTS

The present invention is further illustrated by reference to the following examples. Those skilled in the art will appreciate that other and further embodiments are obvious and within the spirit and scope of this invention from the teachings of these present examples taken with the accompanying specification.

EXAMPLE I

A through hole filling paste composition of this invention having the following composition is prepared:

4 grams of a gold screen printing paste (DuPont Company, Wilmington, Delaware, Gold paste composition 8780)
1.7 grams of silicon carbide particles having a grain size of 5 to 8 microns
0.3 grams of alumino-boro-silicate glass containing lithium oxide and lead oxide having a composition as indicated above and available commercially from the Schott u. Gen. company under the trade designation Glas Powder 8435 Mainz Western Germany
0.5 grams of a diluting oil (diethylene glycol monobutylether acetate).

This composition is prepared by manually mixing using a spatula on a marble plate.

When this composition is used to fill through holes in a ceramic substrate using an apparatus as shown in FIG. 3, the resulting treated substrate is sintered at about 850° C for 30 minutes. The product through contacts exhibit very little, if any, shrinkage. Excellent electrical connection between respective conductor paths on opposite sides of the substrate is achieved.

EXAMPLE II

A through hole filling composition of this invention having the following composition is prepared:
8 grams of gold screen printing paste (DuPont Company, Gold paste composition 8780)
1.7 grams of aluminum oxide ($Al_2O_3$) having a grain size of 5 to 8 microns
0.3 grams of a diluting oil (diethylene glycol monobutylether acetate.)

This composition is prepared by the procedure of Example 1

When this composition is used to fill through holes in a ceramic substrate using an apparatus as shown in FIG. 3, the resulting treated substrate is sintered at about 850° C for 30 minutes. This type of product through-contact exhibits very little, if any, shrinkage. and insures excellent electrical connection between respective conductor paths on opposite sides of the substrate is achieved.

EXAMPLE III

A through hole filling composition of this invention having the following composition is prepared by the procedure of Example 1 (100 percent total weight basis):
75 wt.% gold screen printing paste composition (Electro Science Laboratories of Pennsavken, New Jersey paste No. 8810)
20 wt.% $Al_2O_3$ having a particle size of about 5 microns
5 wt.% diluting oil (pine oil)

This composition is prepared by the procedure of Example 1.

When this composition is used to filled through holes in a ceramic substrate using an apparatus as shown in FIG. 3, the resulting treated substrate is sintered at about 850° C for 30 minutes. This type of product through-contact exhibits very little, if any, shrinkage.

Excellent electrical connection between respective conductor paths on opposite sides of the substrate is achieved.

EXAMPLE IV

A through hole filling composition of this invention having the following composition is prepared by the procedure of Example 1. (100 weight percent total basis):

80 wt.% gold screen printing paste (DuPont Company, Gold paste composition No. 8780)

17wt.% silicon carbide particles having a size ranging from 5 to 8 microns 3 wt.% diluting oil (pine Oil)

This composition is prepared by the procedure of Example 1.

When this composition is used to fill through holes in a ceramic substrate using an apparatus as shown in FIG. 3, the resulting treated substrate is sintered at about 850° C for 30 minutes. This type of product through-contact exhibits very little, if any shrinkage and insures excellent electrical connection between respective conductor paths on opposite sides of the substrate is achieved.

DuPont Company gold paste composition 8780, on a 100 weight percent basis, is understood to contain about 80 weight percent of gold particles substantially all of which are under about 10 microns in number average particle size, about 5 weight percent of a preformed fritted glass particles substantially all of which are under about 30 microns in number average particle size, and about 15 eight percent of total organic carrier material. The glass of the fritted particles is understood to be an alumino-boro-silicate material having a composition generally as described herein above.

Electro Science Laboratories Company gold paste composition 8810, on a 100 weight percent basis, is understood to contain about 80 weight percent of gold particles substantially all of which are under about 10 microns in number average particle size, about 5 weight percent of a preformed fritted glass particles substantially all of which are under about 30 microns in number average particles size, and about 15 weight percent of total organic carrier material. The glass of the fritted particles is understood to be an aluminoborosilicate material having a composition generally as described herein above.

The foregoing is considered as illustrative only of the principles of the invention. Further, since numerous modifications and changes will readily occur to those skilled in the art, it is not desired to limit the invention to the exact construction and operation shown and described, and accordingly, all suitable modifications and equivalents may be resorted to, falling within the scope of the invention as claimed.

I claim:

1. In a thick film circuit structure of the type comprising an electrically insulative ceramic substrate in the form of a flattened structure having a pair of opposed, generally parallel side faces and having at least on through hole extending therethrough from one such face to the other thereof, said substrate having conductor paths deposited upon each of said side faces, at least one such conductor path on each said side face being located in adjacent relationship to the perimeter of such one through hole, the improvement which comprises a conductive path extending through and substantially completely filling such one through hole, said conductive path being formed by the steps of a. filling substantially completely such one through hole in a ceramic substrate with a paste composition comprising on a 100 weight percent total weight basis
      1. from about 48 to 64 weight percent of gold in the form of particles at least about 90 weight percent of which have number average particle sizes not greater than about 10 microns and not more than about 5 weight percent of which are larger than about 25 microns,
      2. from about 3 to 9 weight percent of an inorganic binder comprised of a preformed fritted glass in the form of particles having a number average size of less than about 30 microns and characterized by a capacity to sinter when exposed to temperatures ranging from about 800° to 1000° C.,
         said glass comprising on a 100 weight percent total glass wight basis
            from about 30 to 65 weight percent PbO
            from about 8 to 35 weight percent $SiO_2$
            from about 0.5 to 7 weight percent $Al_2O_3$
            from about 0 to 10 weight percent $TiO_2$
         said glass further optionally containing:
            from about 10 to 30 weight percent $B_2O_3$
         in combination with
            from about 10 to 30 weight percent LiO and
            from about 10 to 30 weight percent CdO by replacement of up to about 25 weight percent of each of said PbO and said $SiO_3$ therewith,
      3. from about 15 to 40 weight percent of inorganic refractory particles having a size in the range from about 5 to 8 microns and characterized by a capacity to not melt at temperatures below about 1000° C., said particles being selected from the group consisting of metal carbides, metal oxides, and quartz, and
      4. from about 9 to 17 weight percent of at least one organic liquid which is substantially inert as respects said gold, said inorganic binder and said particle,
   b. drying the resulting so filled ceramic substrate at a temperature below about 200° C., and
   c. heat the so dried ceramic substrate at a temperature in the range of from about 800° to 1000° C., for a time of less than about 1 hour the extract such time and such temperature relationship in any given instance being sufficient to sinter said compositions, thereby to produce said conductive path, said conductive path being comprised of material which has not shrunk substantially compared to said paste composition as so dried.

* * * * *